United States Patent [19]

Martens

[11] Patent Number: 4,585,285
[45] Date of Patent: Apr. 29, 1986

[54] MULTI-ROW PRESS FIT CONNECTOR FOR USE WITH BUS BARS

[75] Inventor: John D. Martens, Carrollton, Tex.
[73] Assignee: Elfab Corp., Lewisville, Tex.
[21] Appl. No.: 667,292
[22] Filed: Nov. 1, 1984
[51] Int. Cl.[4] .......................... H01R 9/09; H05K 1/11
[52] U.S. Cl. .............................. 339/17 LC; 339/14 R; 361/407
[58] Field of Search ............ 339/17 R, 17 LM, 17 M, 339/17 LC, 17 L, 14 R; 361/407, 412, 413, 415

[56] References Cited
U.S. PATENT DOCUMENTS

| | | | |
|---|---|---|---|
| 3,470,421 | 9/1969 | Shore et al. | 361/407 |
| 4,131,328 | 12/1978 | Minar et al. | 339/14 R |
| 4,241,381 | 12/1980 | Cobaugh et al. | 361/413 |
| 4,483,178 | 11/1984 | Miille | 361/415 |
| 4,512,618 | 4/1985 | Kumar | 339/14 R |

*Primary Examiner*—Neil Abrams
*Attorney, Agent, or Firm*—John E. Vandigriff

[57] ABSTRACT

A multiple row press fit connector is configured so that a bus bar may extend under either end thereof to supply power to a plurality of the connector terminals in the connector. The connector may also be configured to provide for early connect for some of the connector terminals. The connector may be either male or female type and the connector terminals may be positioned in the connector in line across or offset across the connector.

8 Claims, 15 Drawing Figures

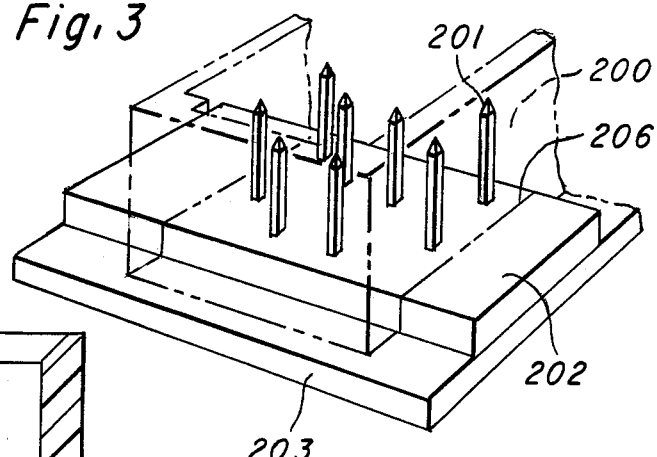
Fig. 3
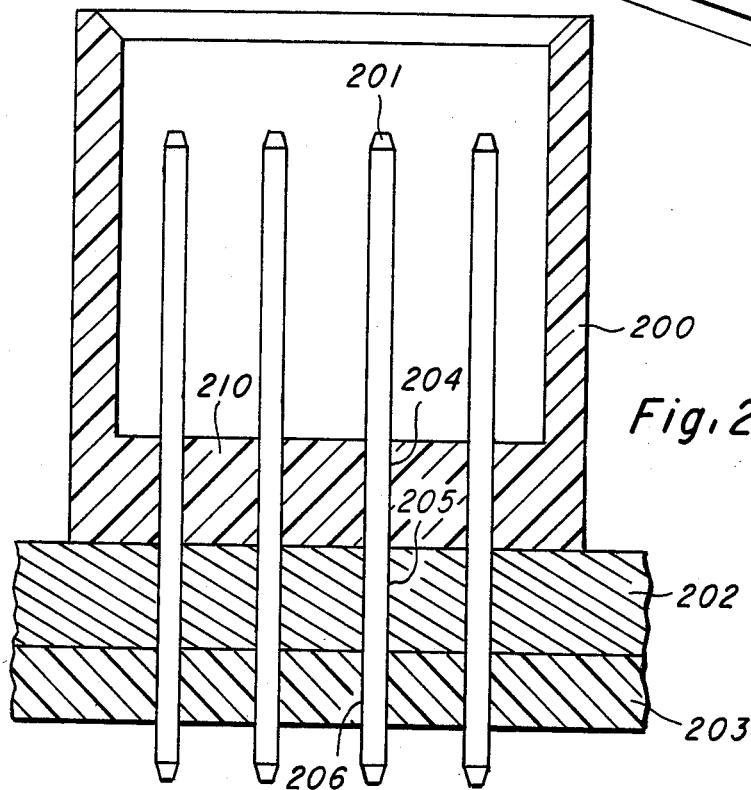
Fig. 2
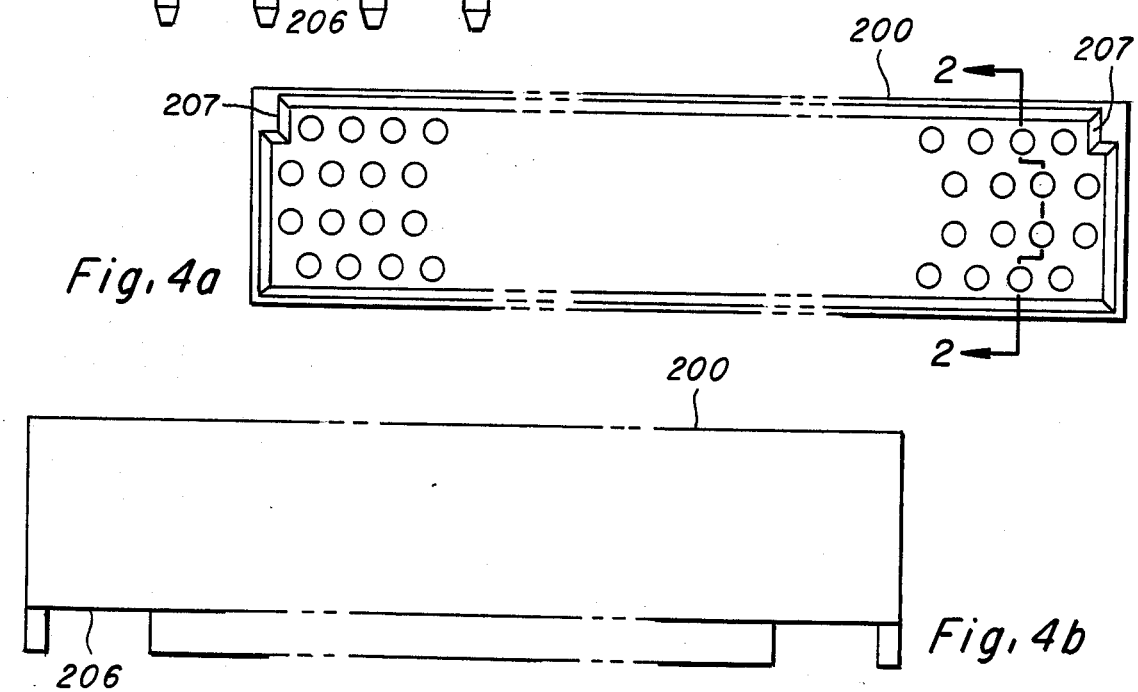
Fig. 4a
Fig. 4b

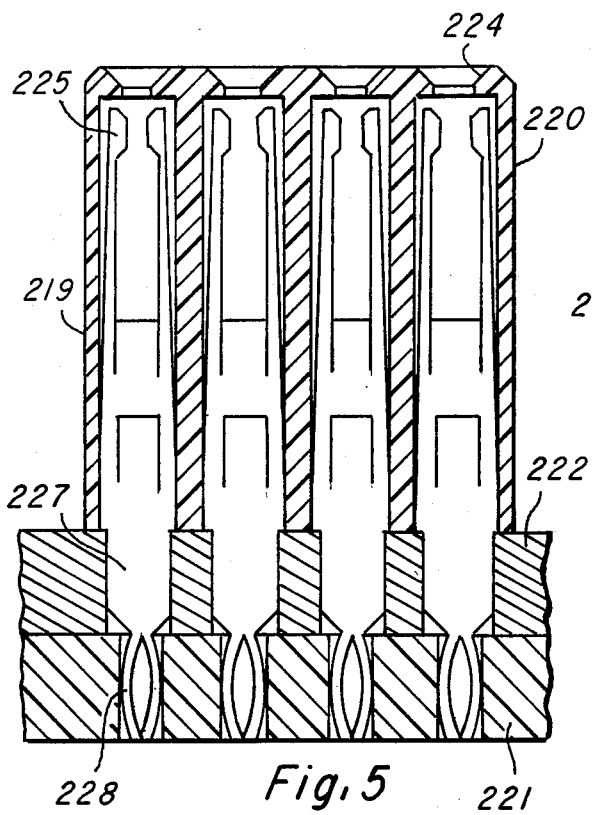
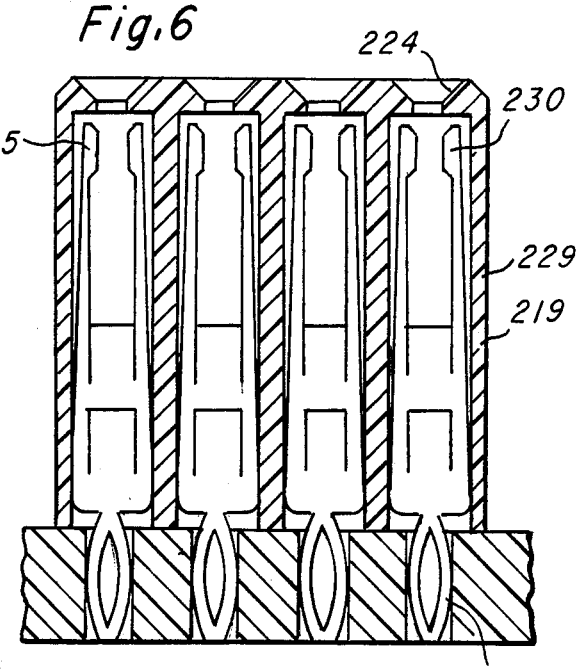
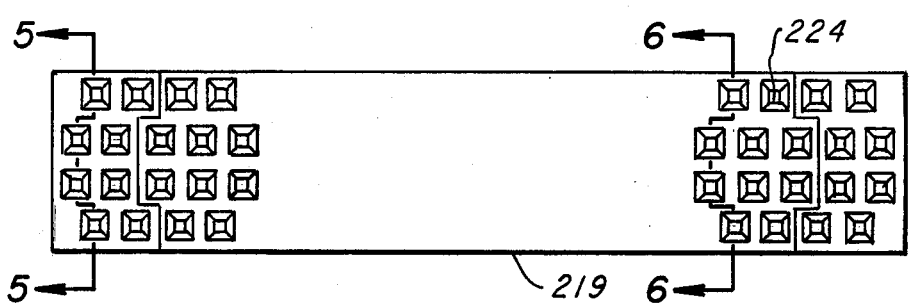
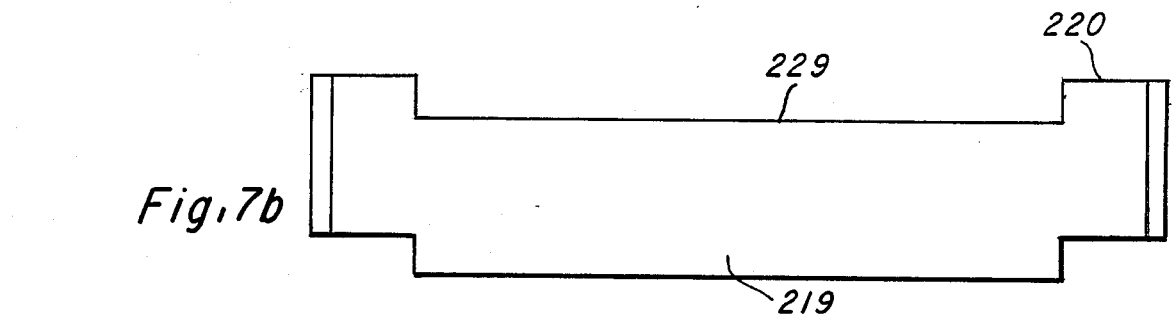
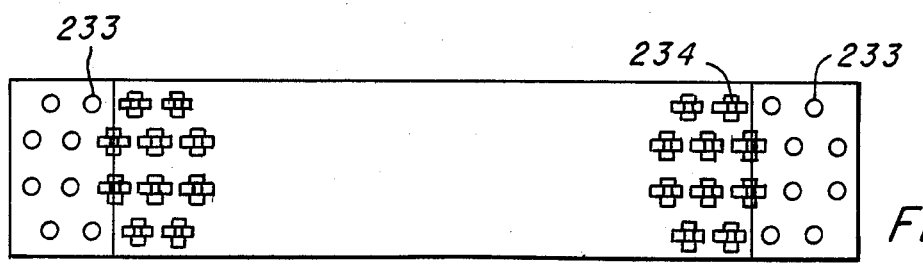

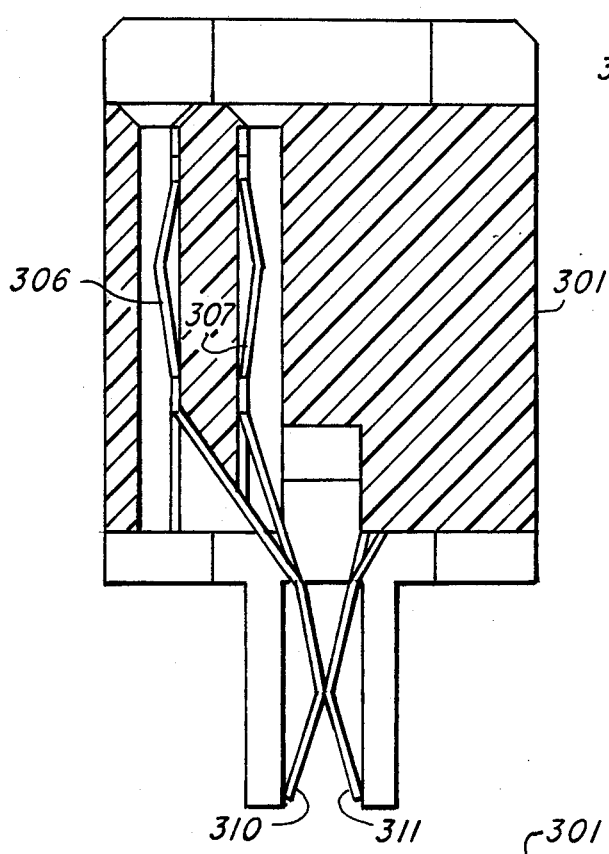
Fig. 8
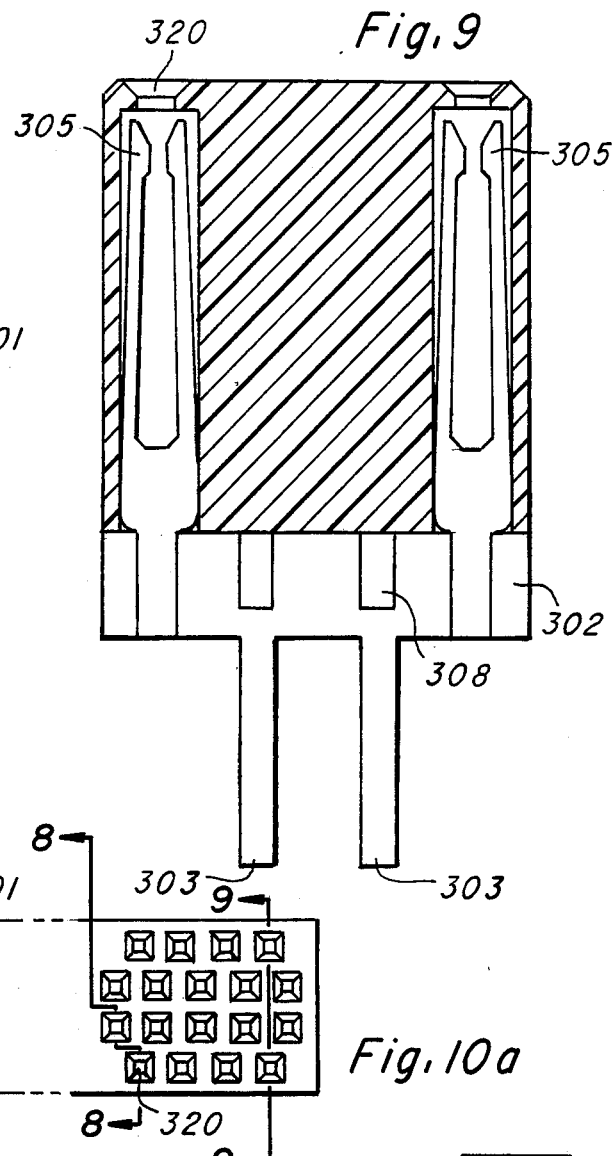
Fig. 9
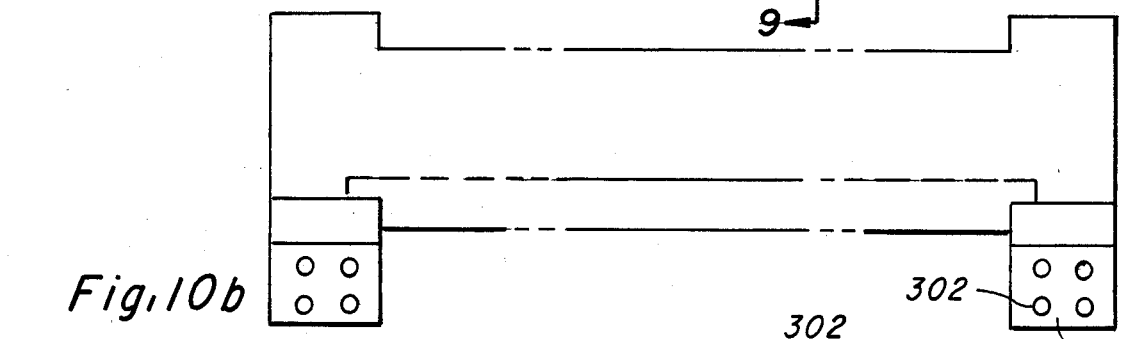
Fig. 10a
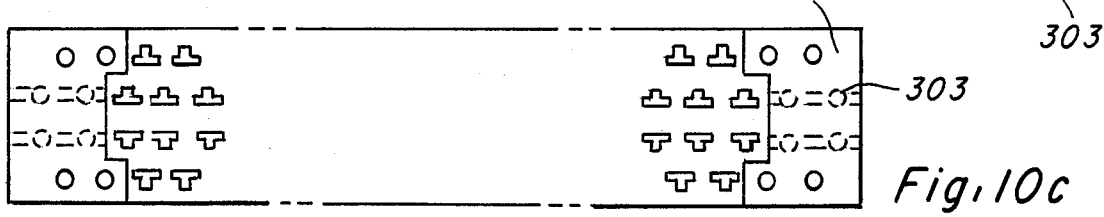
Fig. 10b
Fig. 10c

MULTI-ROW PRESS FIT CONNECTOR FOR USE WITH BUS BARS

FIELD OF THE INVENTION

This invention relates to connectors and more particularly to press fit connectors having provision for a bus connection to a plurality of terminal pins and for early connection to selected terminal pins.

BACKGROUND OF THE INVENTION

With the increasing complexity of backpanel designs it is necessary that the back panel be able to handle large amounts of current and to conduct these currents to a plurality of daughter boards. Bus hardware has been integrated into the backpanel by locating a layer of copper in the laminated structure of the backpanel. It has also been located on the top or bottom of the backpanel. When it has been located on the top or bottom of the backpanel, it usually consist of a strip of heavy copper extending along the surface and positioned adjacent to either the ends of mounted connectors or parallel to the connectors. Straps are then connected to the connector terminals to connected the desired terminals to the bus. When press fit terminals are used, the bus has to be on the bottom side of the back panel so as to be convenient to the connector terminals that extend through the panels.

The common practice has been to use standard connectors for either power or signal connections, with the selection of the power connections depending upon the placement of the bus. The maximum power normally carried by a mated contact pair is about 1 ampere, it is therefore necessary to connect contacts in parallel to handle higher power. With the use of standard connectors, it is necessary to adapt the connectors to a scheme of interconnection that joins several contact terminals to handle the higher power requirements.

The placement of the power buses is limited to areas adjacent to the ends of the connectors or parallel to the connectors. The joined contact terminals then have to be externally connected to the buss.

SUMMARY OF THE INVENTION

The invention is to a backpanel with a surface mounted bus and to a press fit connector which is to be installed on a back panel or a printed circuit mother board. In one embodiment of the invention, a press fit connector is provided with a raised end to facilitate the early connection of a portion of the contacts. A group of contacts on each end of the connector are connected together to provide for a larger current supply that a single contact is able to supply. It is some times desirable to have the power connected to certain parts of a circuit board before it is connected to other parts. The raised portion of the connector allows the contacts of the raised portion to make connected with the mating connector before the contacts that are not raised.

Another feature of the invention is the provision for mounting the connector on a bus bar to interconnect several contacts of the connector to provide a greater power handling capability. The contacts of the connector are press fitted into the circuit board on which the connector is mounted or into a bus bar when the connector is the type to mount on a bus bar. The connector may be either male or female type and may be a multiple row connector with the contacts in line across the connector or in a staggered pattern.

The novel features of the invention and the technical advance represented thereby will readily understood from the following description of a preferred embodiment of the invention when read in conjunction with the claims and drawings in which:

FIG. 2 is a cross sectional view of one of the connectors of the present invention taken across section 2—2 of FIG. 4a;

FIG. 3 is a partial view of of a connector mounted on a bus bar;

FIGS. 4a and 4b are top and side view of a connector of the present invention;

FIG. 5 is a cross sectional view of a first regions of press fit connector of the present invention taken across section 5—5 of FIG. 7a;

FIG. 6 is a cross sectional view of a second region of a press fit connector taken across section 6—6 of FIG. 7a;

FIGS. 7a, 7b and 7c are top, side and bottom views of the connector of FIGS. 5 and 6;

FIG. 8 is a first cross sectional view of a card edge connector having four rows of contacts taken cross section 8—8 of FIG. 10a;

Figure 1:
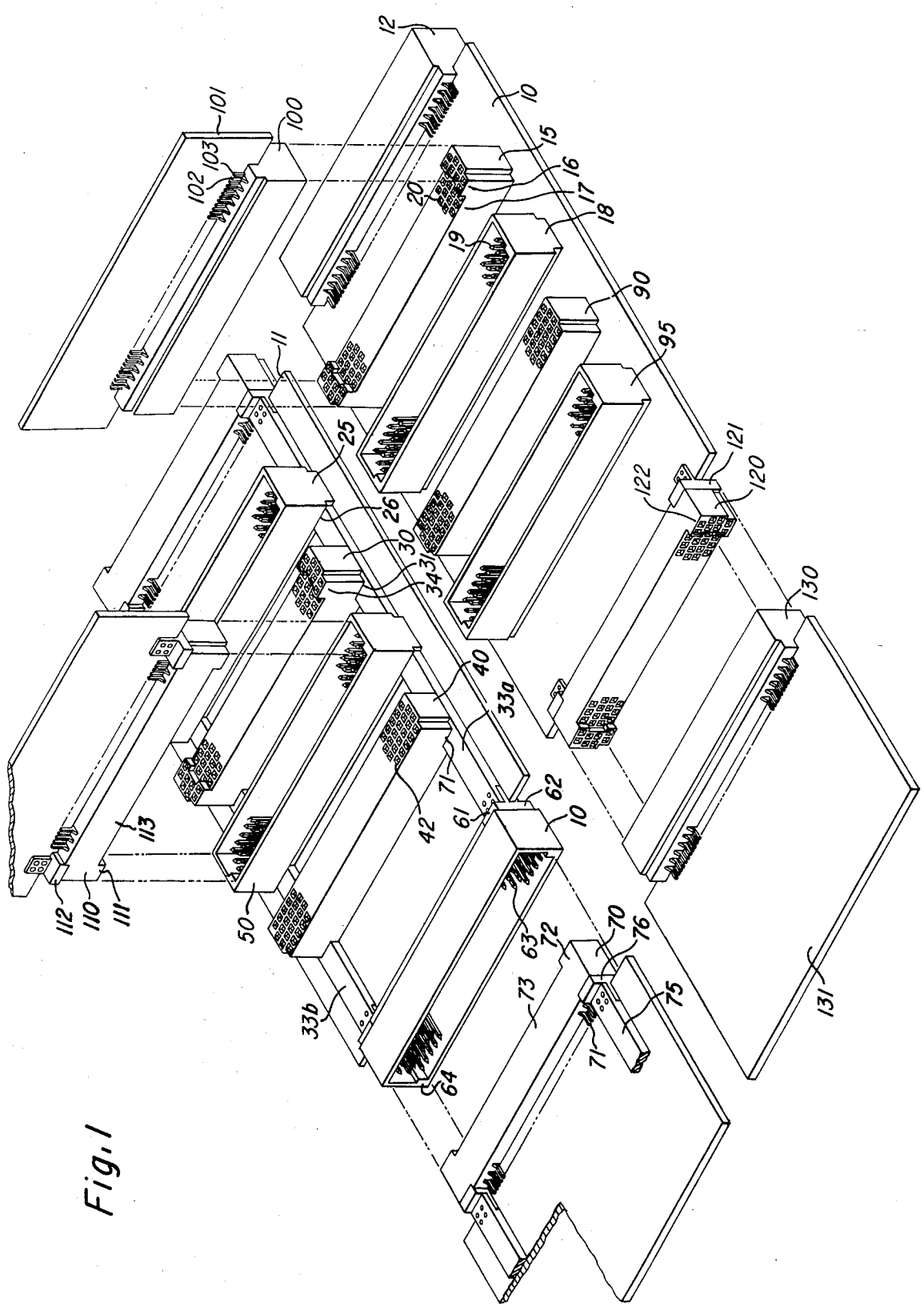
FIG. 1 is a pictorial representation of a backpanel with several connectors of the present invention mounted thereon.

FIG. 9 is a second cross sectional view of a card edge connector with the contacts pressed into a bus connector taken across section 9—9 of FIG. 10a; and FIGS. 10a, 10b and 10c are top, side and bottoms views of the card edge connector of FIGS. 8 and 9.

DESCRIPTION OF THE PREFERRED EMBODIMENT OF THE INVENTION

FIG. 1 illustrates a pair of backpanels with connectors in different configurations. Panel 10 has several connectors attached thereto. Connector 12 is connected to the edge of the panel with contacts that are the same or similar to contacts used with a card edge connector. The connector may be a single or multiple row connector as hereinafter described.

Connector 15 is mounted on one surface of the panel 10 and is joined thereto with press fit contacts. Connector 15 is a multiple row connector with the contacts and contact openings 20 in a staggered configuration across the connector. However, the contacts may be straight across instead of staggered. The ends 16 of the connector 15 are raised so that contacts in the mating connector 100 will make contact before the contacts in the central region 17 of the connectors. Connector 100 is of the type that mounts on the edge of a printed circuit board. The contacts 102 and 103 are bonded to circuitry (not illustrated) on the circuit board 101.

Connector 18 is a press fit mount connector with male contacts 19. The contact configuration of connector 18 is similar to the contact configuration of connector 100 and mates with a connector similar to connector 15.

Connector 90 is similar to connector 15, but connector 90 does not have the raised ends 16. Connector 95 is the same type as connector 18.

Connector 122 is a card edge type connector and has the raised ends 122. Connector 120 also has a mounting buss 121. Buss 121 is used to connect all the contacts of connector 120 that are in the raised part 122 together. Bus 121 may be either a ground bus or a power buss. In either event, all the contacts are electrically connected together.

Connector 130 is also a card edge connector and mates with connector 120. Connector 130 is connected to a circuit board in a manner similar to the connector of connector 12 to panel 10.

The second back panel 11, illustrated in FIG. 1, is similar to panel 10 except that it has two bus bars 33a and 33b extending the length of the panel. The bus bars may be used to supply power to several connector contacts at one time, or to provide a ground connection to the contacts.

Contact 25 has male press fit contacts and mounted on panel 11 such that the ends of connector 25 reside over the two buses 33a, and 33b. Connector 25 has a notch 26 in each end through which the buses extend.

Connector 50 is the same type connector as connector 25. Positioned above connector 50 is connector 110 which mates with connector 50. Connector 110 has raised ends 111 and a lower mid section 113. A bus connector 112 is on each end of connector 110 and electrically joins all of the contacts in its raised ends. The connector is a card edge type connector and in connected to a printed circuit board.

Connector 30 is a press fit connector having raised ends 34 and are notched on each end at 31 to provide a flush mount on the panel and to provide for the buses 33a and 33b.

Connector 40 is a press fit connector, but does not have the raised ends. It has the bus notches 41. The contact openings 42 are shown staggered across the connector may be in line.

Connector 60 is mounted on the edge of panel 11 and has bus mounts 62 on each end. Connector 60 also has card edge type contacts 63. Each connector is keyed so that the mating connector cannot be incorrectly connected. The key is illustrated on connector 60 at 64.

Connector 70 is similar to connector 110. Connector 70 is mounted on the edge of a printed circuit board, has raised ends 72, and bus notches with bus mounts 76 mounted therein. Contacts 71 connect to each side of the printed circuit board and are bonded to printed circuitry (not illustrated). The bus mounts 76 are connected to a bus 75.

FIGS. 2, 3, 4a and 4b illustrate a multiple row male connector in which the contact terminals are press fitted over bus bars into a circuit panel.

FIG. 2 is a cross sectional view of the connector. The section is not a straight section but is taken through four contacts (see Section 2—2 in FIG. 4a) that are not in line across the connector. The connector body 200 is an open shell with four rows of contacts extending through the bottom portion 210 of the connector body 200. Contacts 201 extend through the openings 204 and are press fitted into bus bar 202 that extends under connector body 200. The contacts 201 are also press fitted into the printed circuit board 203 on which the bus bar 202 resides.

FIG. 3 is partial pictorial view of the connector of FIG. 2 illustrating the connector 200, bus bar 202 and printed circuit board 203 with the contacts 201 extending through the bottom of the connector insulator 200 into the bus bar.

FIGS. 4a and 4b are respectively top and side views of the connector insulator 200. In FIG. 4a, the openings 204 are arrayed in a pattern four across. As illustrated, the openings are not in line, however they may be in line if the design so dictates.

On each end of the insulator is an offset 207 that may be used as a key to ensure that the mating connector is properly joined thereto.

FIG. 4b (also FIG. 3) illustrates the opening 206 on each end of the connector insulator 200 through which the bus bar 202 extends.

FIGS. 5, 6 and 7a, 7b and 7c illustrate another connector using female contacts in conjunction with a bus bar. FIG. 5 is a cross section view 5—5 taken from FIG. 7a, and FIG. 6 is a cross section view 6—6 also taken through FIG. 7a.

FIG. 5 illustrates the connector body 220 with openings 224 in the top side thereof which extend through the connector body. Contacts 225 reside in the openings 224 and extend through the connector body and solid region 227 is press fitted into the bus bar 222. Compliant end 228 of each connector is then press fitted into a circuit board 221.

Contacts 230, illustrated in FIG. 6 to not connected with the bus bar, but are press fitted at end 231 into the circuit board 221.

FIGS. 7b and 7c show only the connector insulator body illustrating in FIG. 7b the stepped region 229 and 220. FIG. 7c illustrate the two different openings 233 and 234 in the connector body for the two different contacts 225 and 230.

FIGS. 8, 9, 10a, 10b and 10c illustrate a connector that is used as a card edge connector and has a power block bus region on each end of the connector. The connector body 301 is in the form of a four row connector having tuning fork configured contacts on each end connected to the power block. The contacts 305 are in openings 320 that extend through the connector body 301. The power block 302 is attached to the bottom of the connector at each end thereof. The contacts are press fitted into the power block. The power block has two extensions 303 extending from the power block. The printed circuit board that the connector is connected to is placed between the extension and held there by rivets or screws. The power block may also be attached to any power bus that extends to the edge of the printed circuit board. FIG. 9 is a cross sectional view of the connector taken through section 9—9 of FIG. 10a.

FIG. 8 is a cross section view of connector 301 taken through section 8—8 of FIG. 10a. Since the power blocks are only on the ends of the connector, the contacts in the central portion of the connector connected direct to the printed circuit board. The contacts are configured as illustrated in FIG. 8. There are two contact configurations, 306 and 307. The difference in configurations arises from the fact that one contact is in the outer row of contacts and the other configuration is in a central row of contacts. However, in each case the contact extends through the opening 320, out the bottom of the connector housing and then angles toward the center line of the bottom of the connector body. The contact ends, illustrated in FIG. 8 as 310 and 311 are separated when a printed circuit board is inserted between the ends, and the ends are bonded to the printed circuit board to make electrical contact with the circuitry on the board, and to assist in the mechanical connection of the connector to the board.

FIGS. 10a, 10b and 10c are top, side and bottom views of the connector body illustrating the openings 320 in top and the mounting of the power block 302 on each end of the connector body.

Backpanels with and without bus bars have been illustrated as well as several connectors to be used with the backpanels. The connectors have unique features to allow the connector to be mounted over the bus bars and to permit a select group of the contact terminals of each connector to electrically engage selected contact terminals of a mating connector before the contacts not in the select group are engaged. While only selected preferred embodiments have been illustrated, various other embodiments are possible, which other embodiments will be apparent to those skilled in the art after reading the foregoing description and the appended claims.

What is claimed is:

1. A connector for surface mounting and at lease two bus bars mounted on a printed circuit board, the connector including an insulative connector body and having one or more rows of contacts placed along the length of the connector body, and selected ones of the contacts connected to one of said bus bars, characterized by a notched region on each end of the connector body for accommodating the placement of each connector end over a bus bar, and a plurality of the contacts associated with each notched end, said contacts, associated with each notched end of the connector body, having ends suitable for press fitting into holes in the bus bar under the notched ends of the connector body, and the connector body being formed as an integral structure with said notched regions prior to location of the bus bars in the notched regions, all of said contacts in said connector body being located for electrical engagement with corresponding contacts placed along the length of a mating connector.

2. The connector according to claim 1, characterized in that the contacts associated with the notched ends of the connector are of a different length than contacts not associated with the notched ends of the connector.

3. The connector according to claim 2, characterized in that the notched ends of the connector body have raised portions on the side of the connector opposite the notched side.

4. The connector according to claim 3 characterized in that the portion of the connector having raised portions includes contacts in the raised portion that connect to the corresponding contacts in the mating connector before the contacts in the non-raised portion connect to their corresponding contacts.

5. The combination of a connector and at least two bus bars for mounting on a printed circuit board, said connector including an insulative connector body and having at least two rows of paired contacts along the length of the connector body, and having a predefined number of contacts in each end of the length of the connector body that are of a different design from those contacts in the central portion of the length of the connector body, characterized in that each end of the connector body is notched to provide for positioning the connector body over a bus bar, the notched ends of the insulative connector body being formed as an integral structure with said notched regions prior to location of the bus bars in the notched regions, that the predefined number of contacts have a press fit end which is press fitted into holes in the bus bars extending through the notches in the connector body, and that all of the contacts press fitted into the common bus bar are electrically connected together, all of said contacts in said connector body being located for electrical engagement with corresponding contacts placed along the length of a mating connector.

6. The connector according to claim 5, characterized in that said bus bars are an integral part of the connector, there being a bus bar on each end of the connector and that a mounting tab is on each bus bar for attaching the connector to a circuit board.

7. The connector according to claim 6, characterized in that the contacts therein are of the type to connect to a circuit board edge.

8. The connector according to claim 5, characterized in that the connector has a plurality of rows of contacts and that the contacts are in line across the connector.

* * * * *